United States Patent
Rueger et al.

(10) Patent No.: US 7,298,308 B1
(45) Date of Patent: Nov. 20, 2007

(54) DELTA-SIGMA MODULATOR HAVING PREDICTIVE-CONTROLLED POWER CONSUMPTION

(75) Inventors: Timothy Thomas Rueger, Austin, TX (US); John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 11/465,468

(22) Filed: Sep. 11, 2006

(51) Int. Cl.
*H03M 3/00* (2006.01)

(52) U.S. Cl. ...................................... 341/143; 341/144

(58) Field of Classification Search ......... 341/130–172
See application file for complete search history.

(56) References Cited

U.S. PATENT DOCUMENTS

| | | | |
|---|---|---|---|
| 5,923,273 A * | 7/1999 | Pastorello .................. | 341/143 |
| 6,249,236 B1 | 6/2001 | Lee et al. | |
| 6,369,745 B1 | 4/2002 | Lee et al. | |
| 6,552,676 B1 * | 4/2003 | Bjorksten et al. ........... | 341/143 |
| 6,653,886 B1 | 11/2003 | Lee et al. | |
| 6,670,902 B1 | 12/2003 | Melanson et al. | |
| 6,809,672 B2 * | 10/2004 | Gupta ........................ | 341/143 |
| 6,975,258 B2 * | 12/2005 | Pedersen .................... | 341/143 |
| 7,142,144 B1 * | 11/2006 | Farooqi et al. ............. | 341/143 |
| 7,190,296 B2 * | 3/2007 | Gupta ........................ | 341/143 |

OTHER PUBLICATIONS

Kasha, et al., "A 16-mW, 120-dB Linear Switched-Capacitor Delta-Sigma Modulator with Dynamic Biasing", IEEE Journal of Solid-State Circuits, vol. 34, No. 7, Jul. 1999, IEEE Press.

* cited by examiner

*Primary Examiner*—Lam T. Mai
(74) *Attorney, Agent, or Firm*—Andrew M. Harris; Mitch Harris, Atty at Law, LLC

(57) ABSTRACT

A delta-sigma modulator having predictive-controlled power consumption provides for reduced power consumption in analog-to-digital converters. The initial integrator stage of the delta-sigma modulator has a bias control input, which controls the level of power consumed by the integrator. The bias control input is coupled to a predictor circuit that predicts the level of change at the output of the integrator for the sample cycle. The predictor circuit may use changes in the output of the modulator quantizer alone or in combination with measured changes in the input signal in order to predict the level of change in the integrator output. The quantizer output may be differentiated to remove low frequency components and thereby provide the predictive input from the quantizer. Alternatively, steps in the quantizer output computed by differences may be used directly.

17 Claims, 4 Drawing Sheets

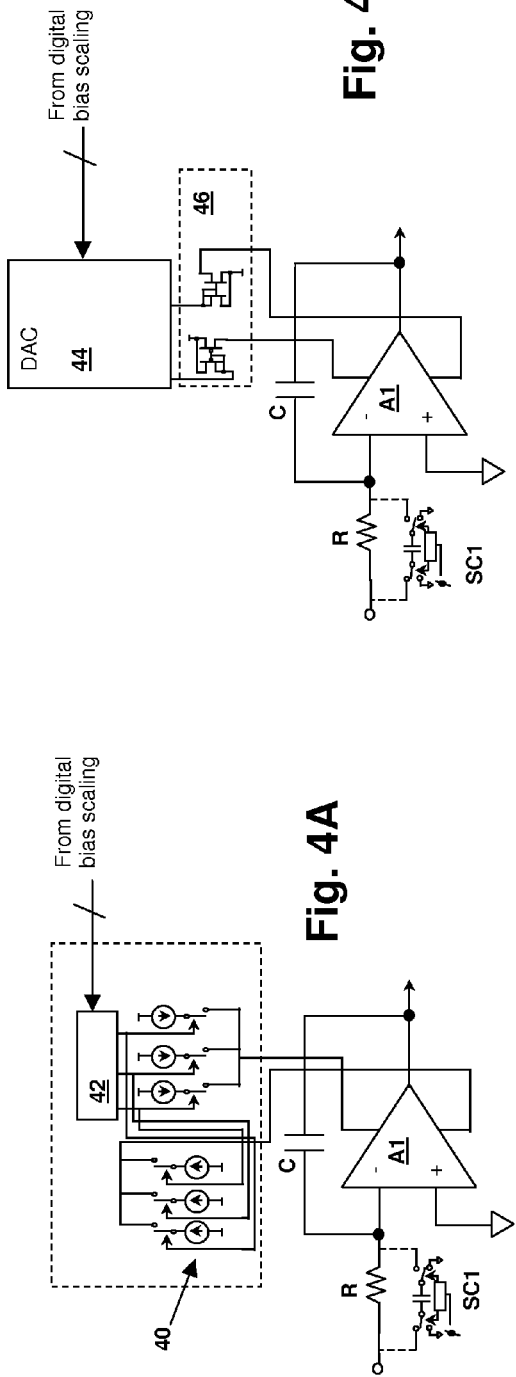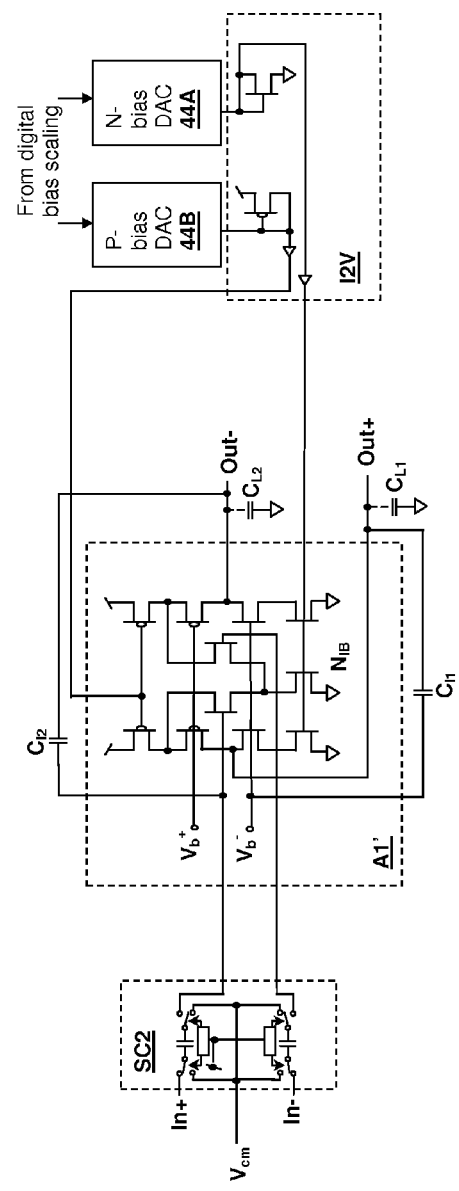

US 7,298,308 B1

DELTA-SIGMA MODULATOR HAVING PREDICTIVE-CONTROLLED POWER CONSUMPTION

BACKGROUND OF THE INVENTION

1. Field of the Invention

The present invention relates generally to delta-sigma modulators/converters, and more specifically, to power consumption control in a delta-sigma modulator.

2. Background of the Invention

Delta-sigma modulators are in widespread use in analog-to-digital converters (ADCs) and digital-to-analog converters (DACs), in which they provide very linear behavior and simple implementation due to the reduced number of bits used in the analog signal comparison. Delta-sigma modulators can be implemented with a high level of control of the frequency distribution of "quantization noise", which is the difference between the ideal output value of the modulator as determined by the input signal and the actual output of the modulator provided by a quantizer. The relative simplicity of the architecture and the ability to finely control the quantization noise makes delta-sigma converter implementations very desirable.

Power consumption in delta-sigma designs is usually dominated by the current requirements of the amplifier in the first integrator stage of the modulator loop filter. The feedback correction signal provided at the input of the first integrator stage contains large magnitude high frequency components. The analog input signal may also contain such high frequency components. The change in the integrator output over a sampling interval is proportionate to the difference between the input signal and feedback correction/noise-shaping signal for that interval. Therefore, the output current capability of the first amplifier must be sufficient to handle the rate of charging of the integrator capacitor for any possible slope (for continuous-time integrators) or step (for discrete-time integrators). Since the changes at subsequent stages of the integrator are dependent on already-integrated versions of the quantizer output, the changes at those integrators are typically smaller. Consequently, the first integrator stage amplifier is typically dominant in the modulator power requirement.

It is generally desirable to lower circuit power requirements, in particular in battery-operated equipment, but in general for reduced heat generation and power supply requirements.

Therefore, it would be desirable to provide a delta-sigma modulator having reduced power requirements.

SUMMARY OF THE INVENTION

The above stated objective of reducing the power requirement of a delta-sigma modulator is achieved in a delta-sigma modulator circuit and its method of operation.

The delta-sigma modulator includes a bias control circuit that controls power supply current through the first integrator amplifier, generally by adjusting a bias of a current sink or by selecting among a plurality of current sinks in line with the power supply connections of the amplifier. The bias control circuit controls the power supply current level proportionate with a predicted change in the output of the first integrator for the sampling cycle, so that the amplifier response is increased when needed, i.e., when the integrator change is large for a given operating cycle.

The bias control circuit predicts the change at the output of the integrator in operational dependence on the quantizer output of the delta-sigma modulator, and optionally in dependence on the delta-sigma modulator input signal.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

FIGS. 4A-4C are schematics depicting amplifier power supply current control schemes that may be employed in the delta-sigma modulators of FIGS. 1-3.

DESCRIPTION OF ILLUSTRATIVE EMBODIMENT

The present invention encompasses a method and apparatus for reducing power consumption in a delta-sigma modulator. The method is a method of operation of a delta-sigma modulator circuit that embodies the invention. Power consumption is controlled by controlling the power supply current through the amplifier that implements the first integrator of the delta-sigma modulator loop filter. A bias control circuit controls the power supply current by switching among different-valued current sources or setting an analog bias signal that controls a power supply current sink or source. Alternatively, the power consumption of the amplifier may be controlled by setting internal bias points of the amplifier. Examples of such amplifiers are disclosed in U.S. Pat. Nos. 6,653,886, 6,249,236 and 6,369,745, which are incorporated herein by reference. Specific applicable embodiments of power-consumption-controlled integrators will be disclosed in further detail below.

The bias control circuit predicts a change in the output of the first integrator and alters the bias current in proportion to the change, so that the first integrator's amplifier current-sourcing capability is improved for samples requiring a larger magnitude integrator output slope or step. A larger slope/step requires more charging current into the integrator capacitor and other connected devices. The resulting operation maintains the responsiveness of the delta-sigma modulator, while reducing power consumption overall, since power supply current is reduced when a large change in the integrator output is not occurring.

Figure 1:
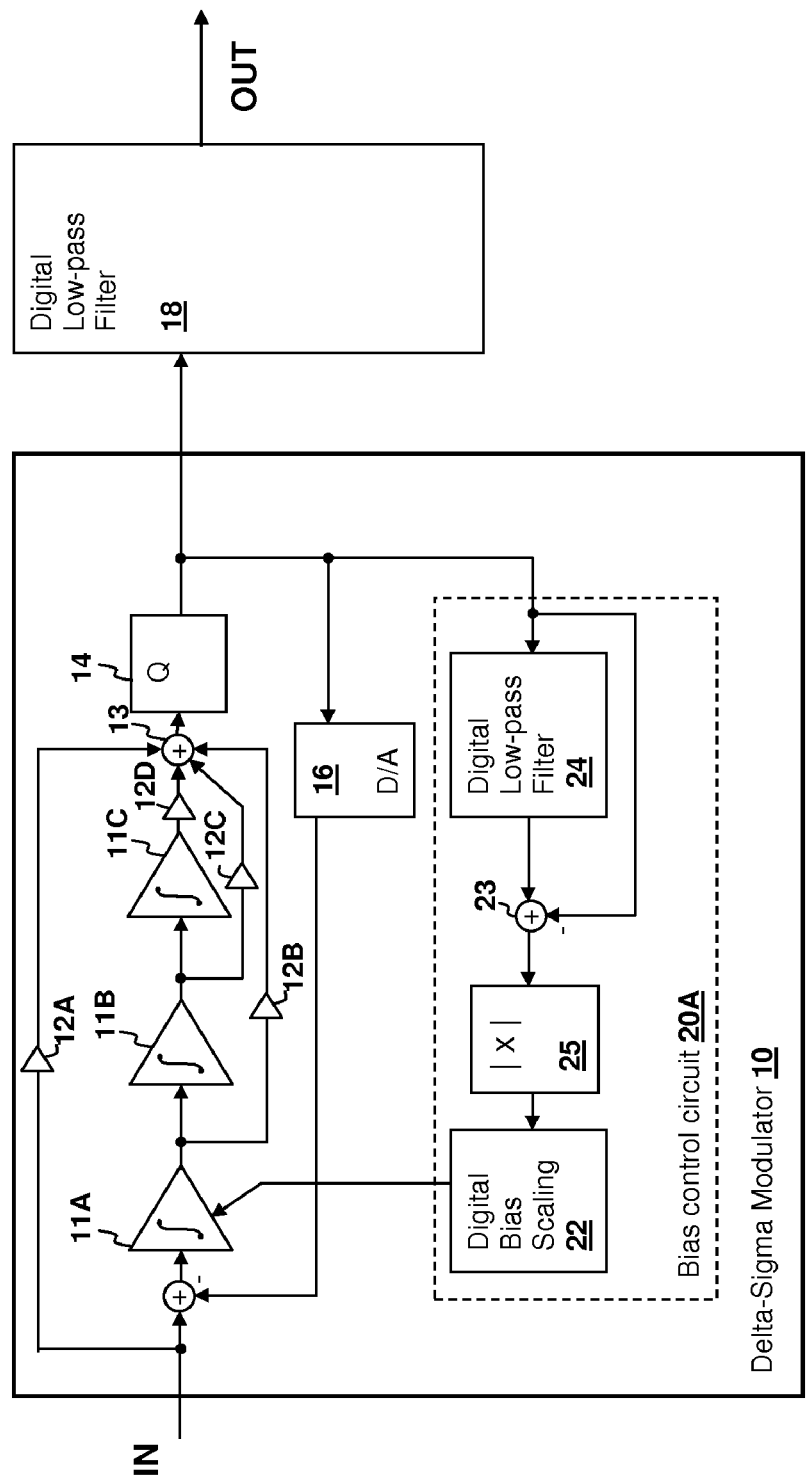
FIG. 1 is a block diagram depicting a delta-sigma modulator in accordance with an embodiment of the present invention.

Referring now to FIG. 1, a circuit in accordance with an embodiment of the present invention is shown. A noise shaping delta-sigma modulator 10 has an input IN and provides a noise-shaped output from a quantizer 14. The output is applied to a digital low-pass filter 18, thereby providing a digital output OUT corresponding to the analog input IN. Thus, the depicted circuit forms an analog-to-digital converter (ADC). However, the techniques of the present invention apply to any delta-sigma modulator and to integrating measurement circuits in general.

Delta-sigma modulator 10 implements a noise shaper using a series of analog integrator stages 11A-11C that each receive an input signal from the previous stage. The outputs of integrators 11 are scaled by scaling circuits 12B-12D and are combined with the input signal scaled by scaling circuit 12A. The scaled input and integrator output signals are combined by a combiner 13, forming a third-order feed-forward loop filter. Combiner 13 may be a summing amplifier, and scaling circuits 12A-D may be resistors that set the gain of the summing amplifier with respect to the output of each integrator 11. Alternatively, for switched-capacitor implementations, scaling circuits 12 will generally be the input charge-transfer capacitors and associated switching circuits. Quantizer 14 receives the output of combiner 13 and provides feedback to the integrator stages through a coarse digital-to-analog converter (DAC) 16.

A bias control circuit 20A is integrated within delta-sigma modulator 10 and provides control of the power consumption level of integrator 11A. A digital bias scaling circuit 22, which may be a set of selectable current sinks connected directly to a power supply terminal of integrator 11A or a DAC that provides an analog bias control signal to integrator 11A, receives an input that predicts the change in the output of integrator 11A during the next sample cycle of delta-sigma modulator 10. An absolute value circuit 25 (or logical operation that may be integrated within digital bias scaling 22) provides the magnitude of the change, which is used to proportionately control the level of bias or power supply current level supplied to integrator 11A.

The input to absolute value circuit 25 in the illustrated embodiment is provided by a circuit that subtracts the output of quantizer 14 from a smoothed historical quantizer output value provided by a digital low-pass filter 24. Low-pass filter 24 is generally a relatively simple filter compared to output low-pass filter 18, as the delay of low-pass filter 24 should be relatively short in order to accurately predict the change at the output of integrator 11A for the next sample cycle. For example, low-pass filter 24 may compute the average of the four previous quantizer outputs. A combiner 23 subtracts the output of the quantizer from the output of low-pass filter 24 yielding a signal that is a measure of the instantaneous change in the output of quantizer 14.

Figure 2:
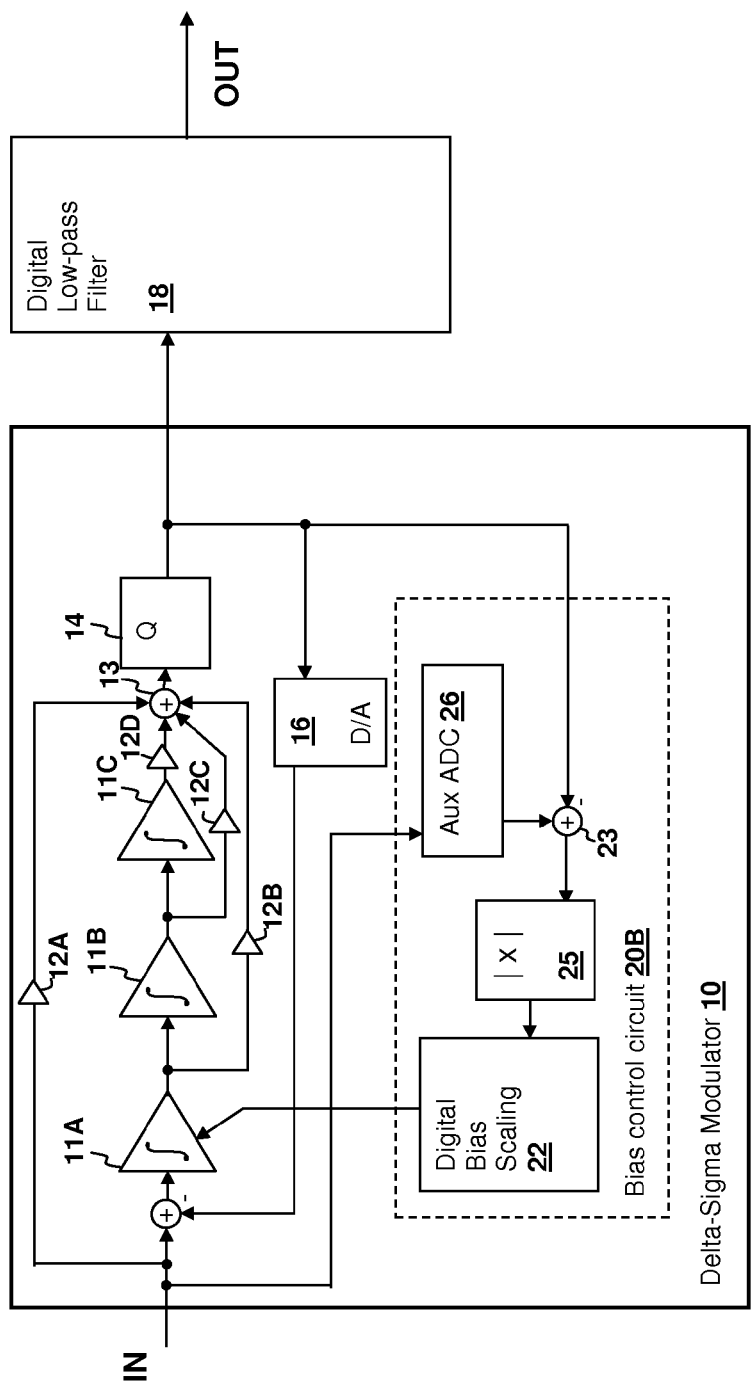
FIG. 2 is a block diagram depicting a delta-sigma modulator in accordance with another embodiment of the present invention.

Referring now to FIG. 2, a circuit in accordance with another embodiment of the present invention is shown. The circuit of FIG. 2 is identical to that of the circuit of FIG. 1, with the exception of differences in bias control circuit 20B. Therefore, only those differences will be described below. Bias control circuit 20B predicts the change in the output level of integrator 11A by combining changes in the delta-sigma modulator input signal IN with the output of the quantizer, yielding a coarse computation of the change in the signal value at the output of integrator 11A. An auxiliary ADC 26 converts the input signal to a digital representation, from which the quantizer output is subtracted by combiner 23. The balance of the circuit is the same as described with respect to FIG. 1; the difference in operation is that the circuit of FIG. 2 is more responsive to large changes in input signal IN.

Figure 3:
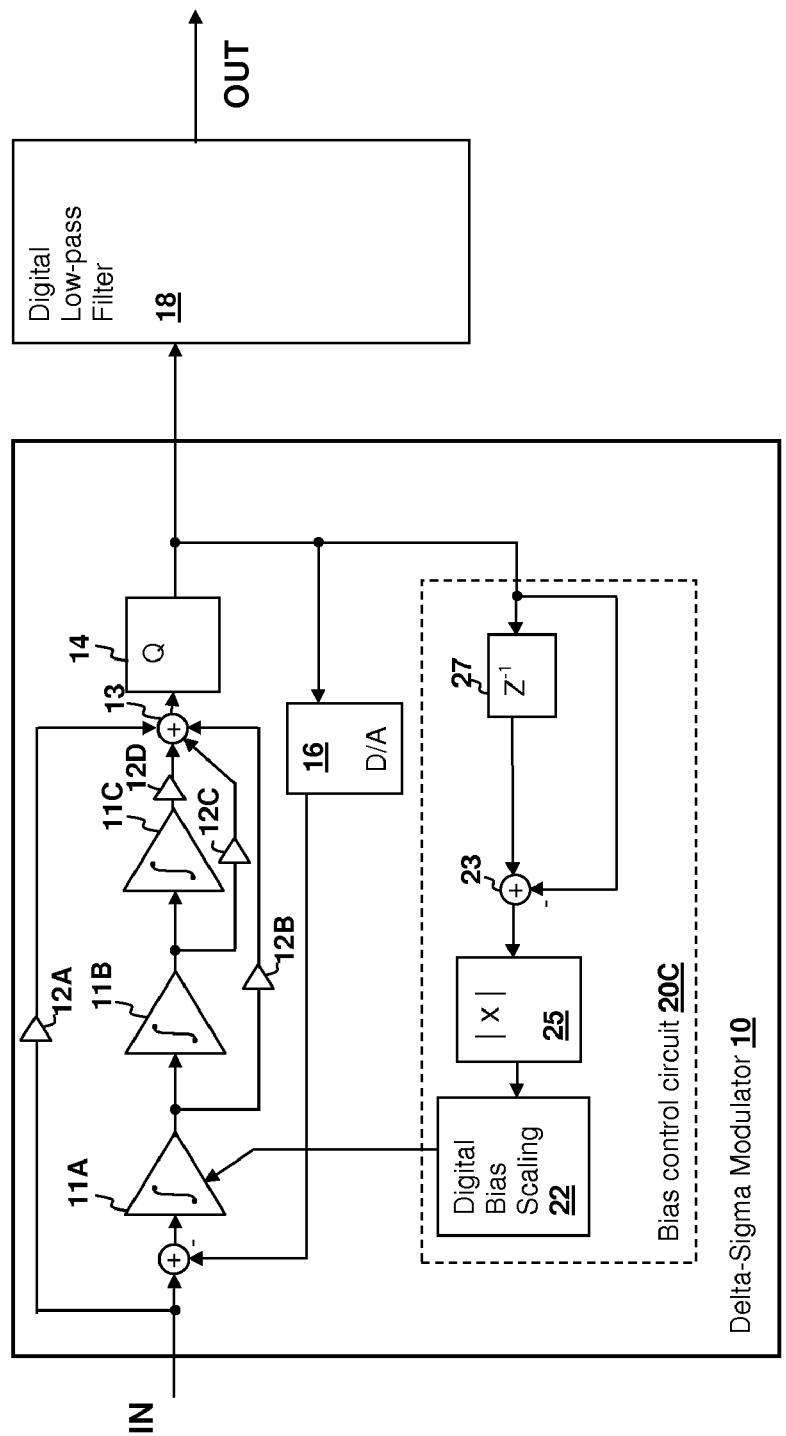
FIG. 3 is a block diagram depicting a delta-sigma modulator in accordance with yet another embodiment of the present invention.

Referring now to FIG. 3, a circuit in accordance with another embodiment of the present invention is shown. The circuit of FIG. 3 is identical to that of the circuit of FIG. 1, with the exception of differences in bias control circuit 20C. Therefore, only those differences will be described below. Bias control circuit 20C predicts the change in the output of integrator 11A by computing the difference in the output of quantizer 14 from the previous cycle value stored in a delay 27. Combiner 23 performs the subtraction and the balance of the bias control circuit 20C is identical to that of bias control circuit 20A of FIG. 1. The circuit of FIG. 3 provides a simpler implementation than the circuits of FIGS. 1 and 2, but lacks the advantage of the circuit of FIG. 2 in responsiveness to rapidly changing input signal and some of the accuracy of the circuits FIGS. 1 and 2 in predicting the integrator change over each sample interval.

Referring now to FIG. 4A, an amplifier power supply current control scheme as may be employed in the delta-sigma modulator circuits of FIGS. 1-3 is illustrated. An amplifier A1, in combination with resistor R and a capacitor C, provides an integrator for the first stage of a delta-sigma modulator as disclosed in FIGS. 1-3. For switched-capacitor implementations, a switched-capacitor input circuit SC1 replaces resistor R1. A set of current switches 40 for each power supply rail are controlled by a control logic 42 that operates the switches in accordance with the digital output of the digital bias scaling circuit 22 in order to limit the current through the power supply rails of amplifier A1.

Referring now to FIG. 4B, another amplifier power supply current control scheme as may be employed in the delta-sigma modulator circuits of FIGS. 1-3 is illustrated. The integrator structure is the same as that of FIG. 4B, but in the depicted embodiment, an analog control scheme is implemented from a digital control input. A set of current mirrors 46, one for each power supply rail, are controlled by the current outputs of a DAC 44 in order to set a current limit on the power supply rails of amplifier A1, in conformity with the outputs of digital bias scaling circuit 22. Current mirrors 46 may be incorporated within amplifier A1 and may be distributed as discrete selectable current sources that control each of the power supply current paths through amplifier A1 in order to scale the power consumption of amplifier A1.

Referring now to FIG. 4C, another integrator power-supply current control scheme that may be employed in the circuits of FIGS. 1-3 is shown. Amplifier A1' is a fully-differential cascoded amplifier design with secondary cascode voltage bias inputs $V_b^+$ and $V_b^-$ supplied from external reference voltage supplies (not shown). Separate P-bias and N-bias DACs 44A, 44B supply control currents that are converted to bias control voltages by a buffered current-to-voltage converter circuit I2V. The voltage outputs of converter circuit I2V provide the primary P and N current source load bias voltages to amplifier A1' and also set the bias current of the input stage of amplifier A1' by setting the gate voltage of transistor $N_{Ib}$. Switched input capacitor stage SC2 applies the differential input voltages In+ and In− to amplifier A1' and the outputs of amplifier A1' provide integrator operation by charging integrator capacitors $C_{I1}$ and $C_{I2}$. Additional load capacitances $C_{L1}$ and $C_{L2}$ are also charged by the corresponding output of amplifier A1', and as mentioned above, must be taken into account in the output current capability of amplifier A1' for a particular power supply control bias level set by digital bias scaling circuit 22 in FIGS. 1-3.

While the invention has been particularly shown and described with reference to the preferred embodiments thereof, it will be understood by those skilled in the art that the foregoing and other changes in form and details may be made therein without departing from the spirit and scope of the invention.

What is claimed is:

1. A circuit, comprising:
   an input node for receiving an analog input signal;
   an integrator having an input coupled to said input node for integrating said analog input signal and having a control input for controlling a power consumption level of said integrator; and
   a control circuit having a control output coupled to said control input of said integrator, wherein said control circuit changes said power consumption level of said integrator in conformity with an expected change in an output level of said integrator, wherein said control circuit comprises a prediction circuit for predicting a magnitude of said expected change, wherein said power consumption level of said integrator is increased in conformity with an increase in a predicted magnitude of said change.

2. The circuit of claim 1, wherein said circuit is a delta-sigma modulator, wherein said integrator is a first integrator stage in said delta-sigma modulator, wherein said delta sigma modulator further comprises a quantizer having an output coupled to an input of said integrator, and wherein said prediction circuit predicts said magnitude of said change at said output of said integrator in conformity with a change in said output of said quantizer.

3. The circuit of claim 2, wherein said prediction circuit comprises:
   a low-pass filter for filtering said output of said quantizer; and
   a combiner for subtracting a value of said output of said quantizer from a value of an output of said low-pass filter.

4. The circuit of claim 3, wherein said prediction circuit further comprises a scaling circuit for scaling an output of said combiner to provide said control output.

5. The circuit of claim 2, wherein said prediction circuit comprises:
   a latch for holding a previous output value of said quantizer;
   a subtractor for subtracting said previous output value of said quantizer from a present output of said quantizer; and
   a magnitude circuit for producing a value proportional to an absolute magnitude of an output of said subtractor to provide said control output.

6. The circuit of claim 1, wherein said circuit is a delta-sigma modulator, wherein said integrator is a first integrator stage in said delta-sigma modulator, wherein said delta sigma modulator further comprises a quantizer having an output coupled to an input of said integrator, and wherein said control circuit is coupled to said input node and computes said magnitude of said expected change from a change in value of said input node and a change in value of said output of said quantizer.

7. The circuit of claim 6, further comprising a multi-bit analog-to-digital converter having an input coupled to said input node and an output coupled to said control circuit for providing an indication of said value of said input node to said control circuit.

8. The circuit of claim 1, wherein said control input of said integrator is a digital control input and wherein said prediction circuit provides a digital output as said control output.

9. The circuit of claim 1, wherein said control input of said integrator is an analog control input, and wherein said prediction circuit comprises a digital-to-analog converter for converting a digital representation of said control output to an analog signal for controlling said analog control input.

10. A method of controlling power consumption in a delta-sigma modulator measurement circuit that includes an integrating first stage having an input node for receiving an analog input signal, comprising:
   determining an expected change in an output of said integrating first stage of said delta-sigma modulator, wherein said delta-sigma modulator has a quantizer coupled to an output of said integrating first state, and wherein said determining determines a magnitude of said expected change from a change in an output of said quantizer; and
   adjusting a power supply current level of said integrating first stage in conformity with a magnitude of said expected change.

11. The method of claim 10, wherein said determining comprises:
   low-pass filtering said output of said quantizer; and
   subtracting a value of said output of said quantizer from a result of said filtering.

12. The method of claim 11, further comprising scaling a result of said subtracting to provide an adjustment value and wherein said adjusting adjusts said power supply current level in conformity with said adjustment value.

13. The method of claim 10, wherein said determining comprises:
   storing a previous output value of said quantizer;
   subtracting said previous output value of said quantizer from a present output of said quantizer; and
   producing a value proportional to an absolute magnitude of a result of said subtracting to provide an adjustment value, and wherein said adjusting adjusts said power supply current level in conformity with said adjustment value.

14. The method of claim 10, wherein said determining computes a magnitude of said expected change from a change in value of said input node and a change in value of said output of said quantizer.

15. The method of claim 14, wherein said determining further comprises converting an analog value of said input node to a digital value using a multi-bit analog-to-digital converter to provide a digital representation of said analog value, and wherein said expected change is further computed in conformity with said digital representation.

16. The method of claim 10, wherein said adjusting is performed by providing an analog control signal to said integrating first stage.

17. The method of claim 10, wherein said adjusting is performed by digitally selecting among a set of current sources in series with power supply connections of said integrating first stage.

* * * * *